(12) United States Patent
Chu et al.

(10) Patent No.: US 6,429,148 B1
(45) Date of Patent: Aug. 6, 2002

(54) ANISOTROPIC FORMATION PROCESS OF OXIDE LAYERS FOR VERTICAL TRANSISTORS

(75) Inventors: Yu-Ping Chu; Yu-Wen Chu, both of Kaohsiung (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 09/971,735

(22) Filed: Oct. 9, 2001

(51) Int. Cl.⁷ .................. H01L 21/31; H01L 21/469
(52) U.S. Cl. ................................................ 438/766
(58) Field of Search ................... 438/766, 758, 438/770, 795–799, 800

(56) References Cited

U.S. PATENT DOCUMENTS 6,184,091 B1   2/2001   Gruening et al.
6,204,109 B1 * 3/2001   Wu .............................. 438/238

* cited by examiner

*Primary Examiner*—Craig Thompson
(74) *Attorney, Agent, or Firm*—Nixon Peabody, LLP; Donald R. Studebaker

(57) ABSTRACT

The method of the present invention forms a thin oxide layer on the circumferential wall of a recess in a trench and, at the same time, forms a thick oxide layer on the bottom surface of the recess. The thick oxide layer serves as the trench top oxide and the thin oxide layer serves as the gate oxide.

8 Claims, 5 Drawing Sheets

ANISOTROPIC FORMATION PROCESS OF OXIDE LAYERS FOR VERTICAL TRANSISTORS

FIELD OF THE INVENTION

The present invention relates to a formation process of an oxide layer, and especially to an anisotropic formation process of an oxide layer in a trench.

BACKGROUND OF THE INVENTION

The semiconductor memory, such as a Dynamic Random Access Memory (DRAM), is usually composed of multiple memory units with storage nodes. The DRAM nowadays generally adopts a trench construction to improve capacitance in shrank memory units. The storage node is accessed through an access transistor, e.g. a vertical transistor, to allow the charge being stored into or retrieved form the storage node. The storage node of memory must be electrically isolated from the gate conductive layer.

A conventional method for ensuring electrical isolation of the storage node is forming a trench top isolation layer over the storage node. The storage node usually includes a trench partially filled with polysilicon. An oxide layer, usually a silicon dioxide, is deposited on the surface of the semiconductor device and also on the aforesaid polysilicon material. The oxide layer on the semiconductor device, except that in the trench, is removed by planarizing the surface. Afterwards, the oxide layer in the trench is etched and a predetermined thickness thereof remains. However, the oxide layer alone may not provide sufficient and reliable electrical isolation. Additionally, the oxide layer etching can not be controlled easily and the thickness of the residual oxide layer varies substantially. It is noted the substantial thickness variation of the remained oxide layer is not allowed in DRAM manufacturing processes.

When a vertical transistor is fabricated in a memory device, a buried strap portion of the storage node, which is under the top trench oxide, must diffuse out and electrically connect to the vertical transistor channel. Therefore, if the transistor is "ON", a bitline electrically connects with the storage node. The channel must electrically isolate from the gate conductive layer through an insulating layer. The insulating layer is usually formed by partially oxidizing polysilicon of the gate oxide layer in the trench.

Many prior art works in this field, such as U.S. Pat. No. 6,184,091 issued to Gruening et al. entitled "Formation of Controlled Trench Top Isolation Layers for Vertical Transistors", are disclosed. Please refer to FIG. 1a, a semiconductor device 100 has a substrate 101, a pad oxide layer 102 and a pad nitride layer 103 thereon. A trench 104 is formed deep into the substrate 101, the pad oxide layer 102 and pad nitride layer 103. A collar 105 is formed in the trench 104 for electrically isolating a portion of trench 104 from the substrate 101. The trench 104 is partially filled with a conductive filler material 106. The filler material 106 extends over the top portion of collar 105 and contacts with the substrate 101. Therefore, a buried strap 108 is formed in the trench. A recess 107 remains at the top of the trench 104. Looking at the recess 107, the recess 107 includes a bottom surface 109 and a circumferential wall 110. The bottom surface 109 is the top surface of buried strap 108.

Please refer to FIG. 1b, the trench top oxide formation starts with a nitride liner 111 formed on the circumferential wall 110. The nitride liner 111 formation is first deposited a nitride liner 111 on the pad nitride layer 103, bottom surface 109 and circumferential wall 110. The nitride liner 111 is preferably a silicon nitride. Then, the nitride liner 111 is removed from all surfaces except the circumferential wall 110. A sub-atmospheric chemical vapor deposition (SACVD) layer 112 is then deposited. The SACVD layer is usually an oxide or an ozone rich TEOS (tetraethoxysilane) layer. The SACVD layer 112 grows at a rate of about 5 times greater on silicon than on nitride. Therefore, the thickness of the SACVD layer 112 is about 5 times thicker on the bottom surface 109 than on the pad nitride layer 103 and circumferential wall 110. Accordingly, it is easy that the SACVD layer 112 on the pad nitride layer 103 and circumferential wall 110 are removed, and on the bottom surface 109 remains the SACVD layer 112 of reduced thickness, as shown in FIG. 1c. In the succeeding processes, the nitride liner 111 is removed and an oxide layer 113 is formed to serve as a gate oxide on the circumferential wall 110, as shown in FIG. 1d.

As mentioned above, the fabrication process of a trench top oxide is complicated. The steps of first depositing the SACVD layer 112, and then etching have multiple variables to control while etching such that stability is low. Before forming the gate oxide 113, the nitride linear 111 must be removed in advance. To improve yield, and to decrease number of steps, it has a demand for a new method for forming trench top oxide and gate oxide with less steps and higher yield.

SUMMARY OF THE INVENTION

An objective of the present invention is to provide a method for forming a trench top oxide and a gate oxide in fewer steps.

Another objective of the present invention is to provide a method for forming the trench top oxide and gate oxide at the same time.

The method of the present invention is to form a thick oxide layer on a bottom surface of a recess and a thin oxide layer on a circumferential wall of the recess. The recess is part of a trench formed in a substrate, and the circumferential wall is perpendicular to the bottom surface. The method includes steps as follows. Inert gas ions are implanted into the bottom surface of the recess at a direction parallel to the circumferential wall. Afterwards, the substrate is thermally processed by using a thermal oxidation process to form a thick oxide layer on the bottom surface and a thin oxide layer on the circumferential wall.

DETAIL DESCRIPTION

Figure 1A:
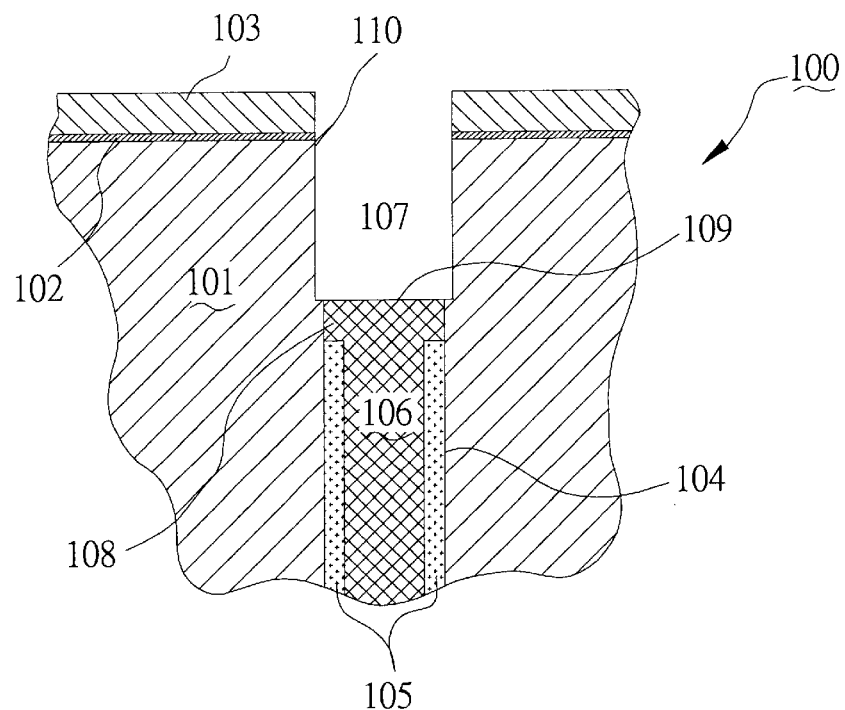
FIG. 1a through FIG. 1d show detailed steps according to the prior art.
Figure 1B:
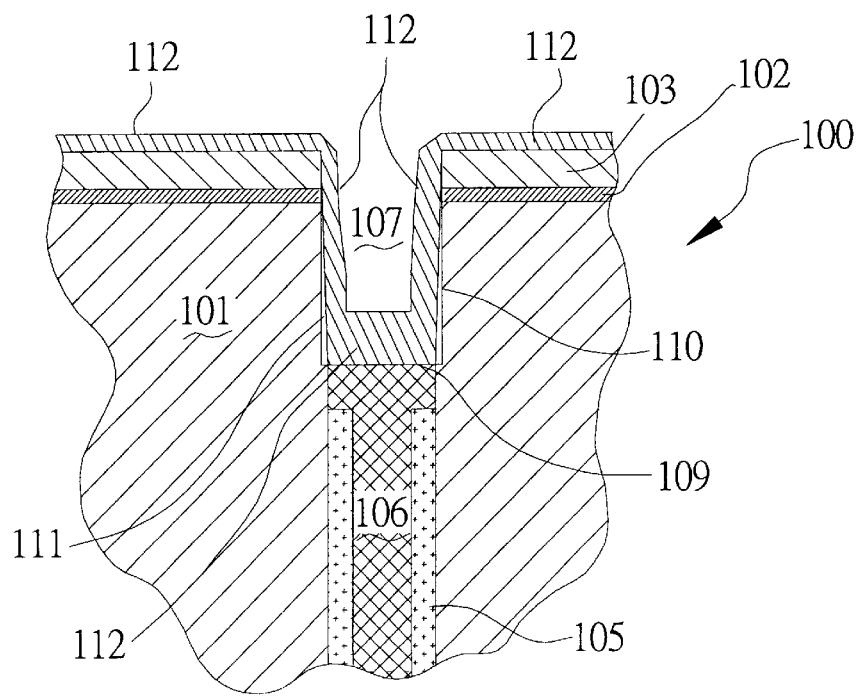
Figure 1C:
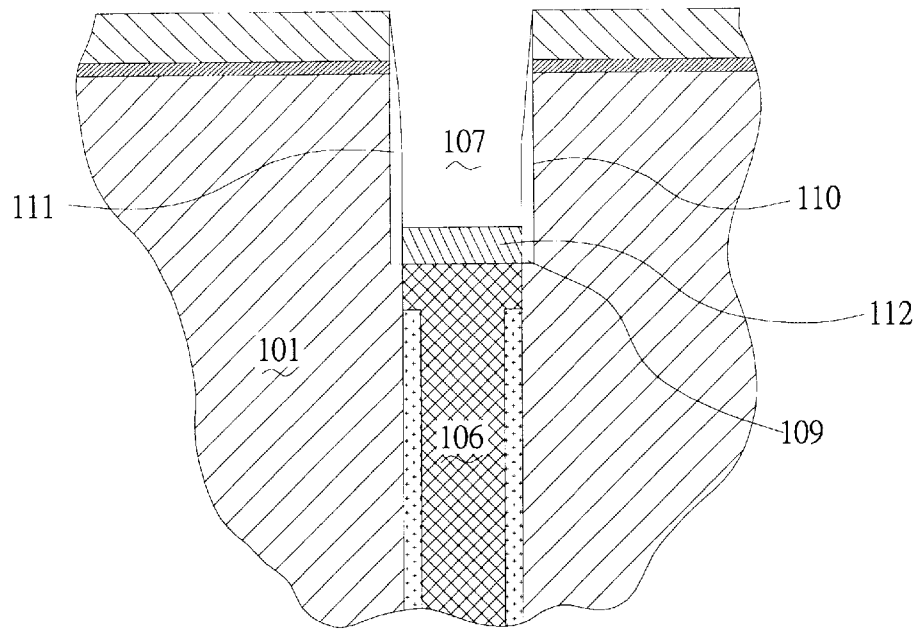
Figure 1D:
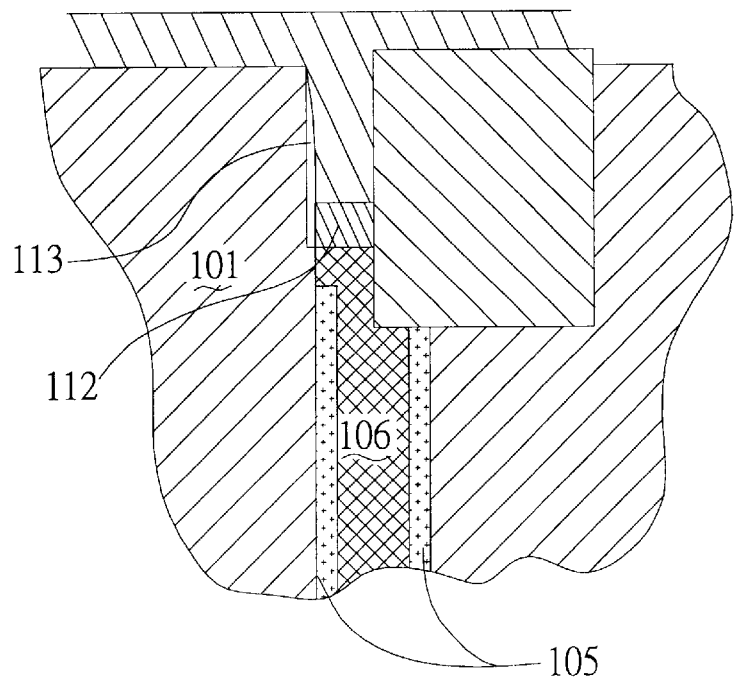
Figure 2A:
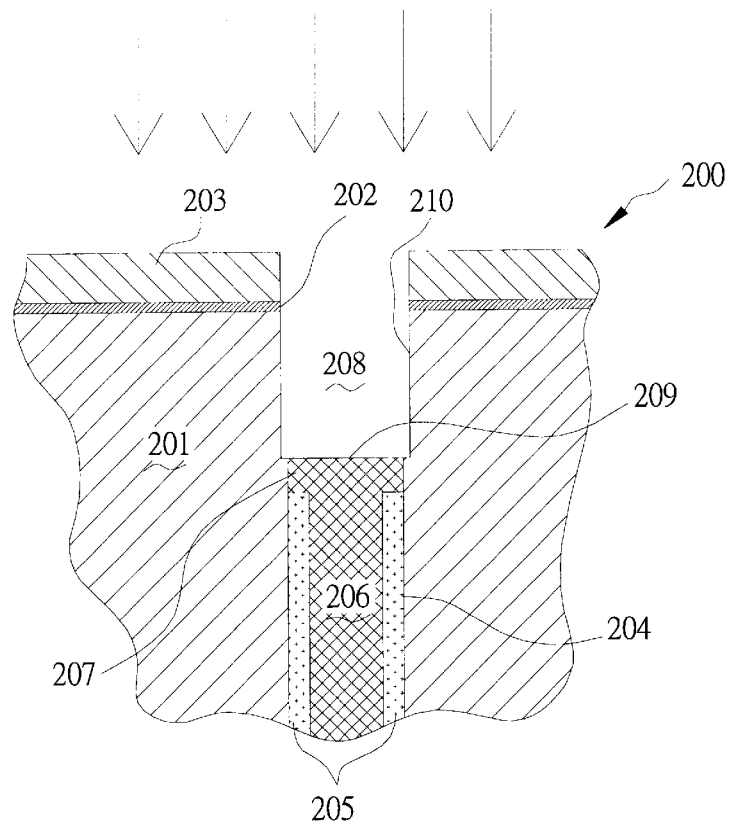
FIG. 2a through FIG. 2b show detailed steps according to the present invention.

Please refer to FIG. 2a, a part of a semiconductor device 200 includes a substrate 201. On the substrate 201 is an oxide protective layer 202, and a nitride protective layer 203 is on the oxide protective layer 202. A trench 204 is in the substrate 201 and has a collar 205 therein. The collar 205 may be formed by different methods with various materials which are known to those skilled in the art. The collar 205 is partially filled with a conductive material 206. The conductive material 206 is usually a polysilicon. The conductive material 206 extends out of the collar 205 and contacts the substrate 201 to form a buried strap 207. In this stage, the lower portion of the trench 204 is filled with the conductive material 206 while a recess 208 remains on the upper portion of the trench 204. The recess 208 includes a bottom surface 209 and a circumferential wall 210. The bottom surface 209 is the top surface of buried strap 207. If the semiconductor device 200 is a DRAM, the recess 208 is located above a trench capacitor, which is composed of the trench 204, conductive layer 206, and the bottom surface 209 of recess 208 is on the top surface of the buried strap 207.

The first step of present invention is to implant inert gas ions into the bottom surface 209 and the nitride protective layer 203 at a direction parallel to the circumferential wall 210. The direction is shown in FIG. 2a by the arrows. The energy level of the noble ion implantation ranges from about 5 to 100 keV and preferably ranges from about 15 to 40 keV. Because the ion implantation is in one direction, the circumferential wall 201 is substantially not affected by the inert gas ions. The inert gas in the present invention, according to the desired cost and outcome, includes neon (Ne), argon (Ar) and krypton (Kr), and Ar is usually employed.

Figure 2B:
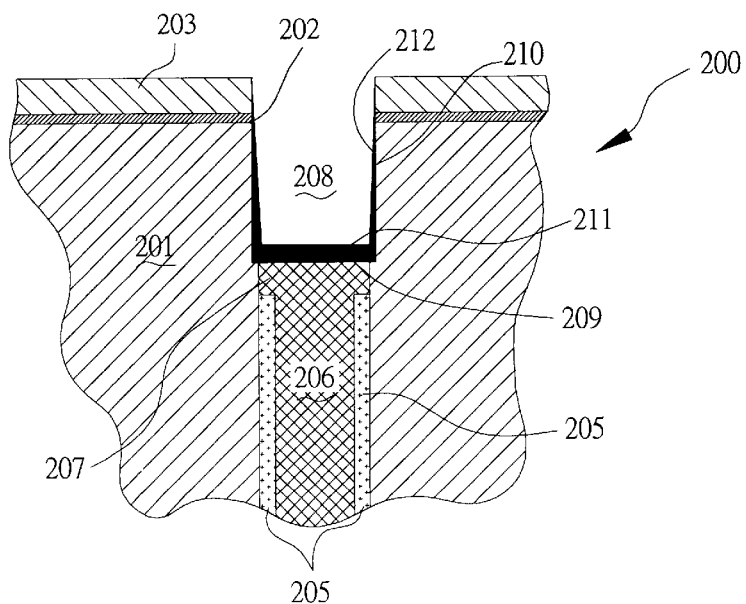

Next, the bottom surface 209 and circumferential wall 210 are thermally processed by a thermal oxidation process, as shown in FIG. 2b. According to experiments, the silicon oxide formation rate in polysilicon and substrates, with ion implantation, by the thermal oxidation process is about 2 to 3 times faster than that without ion implantation.

Figure 3:
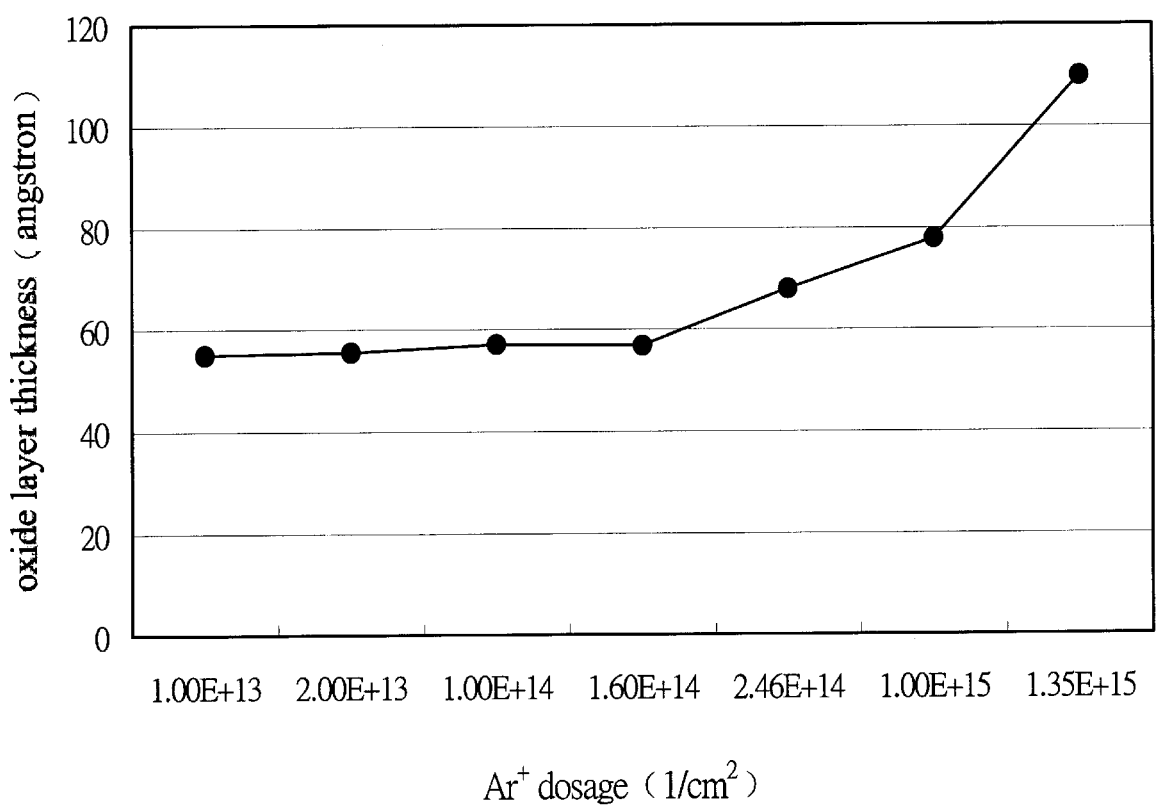
FIG. 3 is a graph of showing the dosage of Ar ions versus the thickness of the oxide layer in the thermal oxidation process.

Please refer to FIG. 3, when the $Ar_+$ dosage is larger than the $1.6E+14/cm^2$, the thickness of the oxide layer rising significantly. Since the bottom surface 209 is implanted by inert gas ions while the circumferential wall 210 is not, by the thermal oxidation process, a thick oxide layer 211 formed on the bottom surface 209 serving as a trench top oxide, and a thin oxide layer 212 formed, at the same time, on the circumferential wall 210 serving as a gate oxide.

Figure 4:
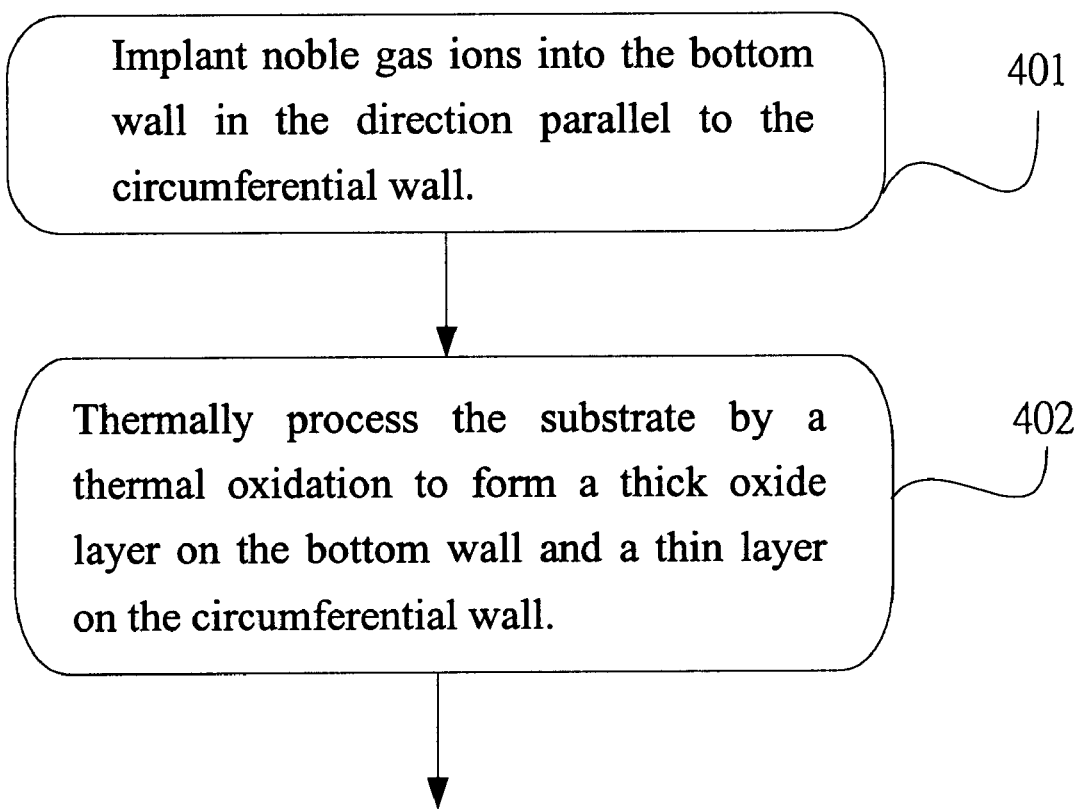
FIG. 4 is the flow diagram of the present invention.

Please refer to FIG. 4, it is the flow diagram of the present invention for fabricating a semiconductor device 200 as shown in FIG. 2b. In the step 401, the bottom surface 209 is implanted by inert gas ions at a direction parallel to the circumferential wall 210, as shown in FIG. 2a. Afterwards, in the step 402, the substrate 201 is thermally processed via thermal oxidation. A thick oxide layer 211 is formed on the bottom surface 209 and a thin oxide layer 212 is formed on the circumferential wall 210, as shown in FIG. 2b.

It is appreciated by those skilled in the art that the present invention can be practiced in other specific ways without departing from the spirit and scope thereof, and therefore the provided embodiments here is illustrative but not restrictive. The scope of the invention should be determined not with reference to the above description but with reference with the appended claims with their full scope of equivalents.

What is claimed is:

1. A method for forming a thick oxide layer on a bottom surface of a recess and a thin oxide layer on a circumferential wall of said recess, wherein said recess is a part of a trench formed in a substrate, and said circumferential wall is perpendicular to said bottom surface, comprising the steps of:

implanting inert gas ions into said bottom surface at a direction parallel to said circumferential wall; and thermally processing said substrate by a thermal oxidation process to form said thick oxide layer on said bottom surface and said thin oxide layer on said circumferential wall.

2. The method of claim 1, wherein said inert gas is selected from a group consisting of neon (Ne), argon (Ar) and krypton (Kr).

3. The method of claim 1, wherein said inert gas is argon.

4. The method of claim 1, wherein said recess is located above a trench capacitor, and said bottom surface of said trench is on a top surface of a buried strap.

5. The method of claim 1, wherein said thick oxide layer is a trench top oxide of a trench capacitor.

6. The method of claim 1, wherein said thin oxide layer is a gate oxide of a vertical transistor.

7. The method of claim 1, wherein said inert gas ion is implanted at an energy level ranging from about 5 to 100 keV.

8. The method of claim 7, wherein said energy level is about 15 to 40 keV.

\* \* \* \* \*